(12) United States Patent
Kanaya et al.

(10) Patent No.: US 11,031,914 B2
(45) Date of Patent: Jun. 8, 2021

(54) DIODE LINEARIZER

(71) Applicant: Mitsubishi Electric Corporation, Tokyo (JP)

(72) Inventors: Ko Kanaya, Tokyo (JP); Kazuya Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/479,009

(22) PCT Filed: Mar. 28, 2017

(86) PCT No.: PCT/JP2017/012640
§ 371 (c)(1),
(2) Date: Jul. 18, 2019

(87) PCT Pub. No.: WO2018/179087
PCT Pub. Date: Oct. 4, 2018

(65) Prior Publication Data
US 2020/0014339 A1 Jan. 9, 2020

(51) Int. Cl.
*H03F 1/32* (2006.01)
*H03F 3/195* (2006.01)
(Continued)

(52) U.S. Cl.
CPC ........... *H03F 1/32* (2013.01); *H01L 29/2003* (2013.01); *H01L 29/861* (2013.01);
(Continued)

(58) Field of Classification Search
USPC ........................................ 330/149, 151, 277
See application file for complete search history.

(56) References Cited

U.S. PATENT DOCUMENTS 6,204,718 B1* 3/2001 Pidgeon, Jr. .......... H03F 1/3276
327/317
7,202,736 B1* 4/2007 Dow ........................ H03F 1/14
330/129
(Continued)

FOREIGN PATENT DOCUMENTS

JP H11-355055 A 12/1999
JP 2001-144550 A 5/2001
(Continued)

OTHER PUBLICATIONS

International Search Report issued in PCT/JP2017/012640; dated Jun. 27, 2017.
(Continued)

*Primary Examiner* — Hieu P Nguyen
(74) *Attorney, Agent, or Firm* — Studebaker & Brackett PC (57) ABSTRACT

A diode linearizer according to the present invention has parallelly mounting linearizer core units on a RF signal path via capacitors between the RF signal path and a ground, thus does not need a switch using an FET, for example, at a time of selectively operating a plurality of linearizer core units. Moreover, the diode linearizer does not need a capacitor in series for blocking a direct current between RF signal input and output terminals. Thus, a range of a gain which can be compensated by the diode linearizer can be increased. Furthermore, an insertion loss of the RF signal path in a state where the diode linearizer is off can be reduced, and a range of a gain expansion in operation can be increased. The switch is not used, or the number of elements of the capacitors which are needed is small, thus a circuit size is also small.

8 Claims, 5 Drawing Sheets

(51) Int. Cl.
*H01L 29/20* (2006.01)
*H01L 29/861* (2006.01)
*H01L 29/872* (2006.01)
*H01L 27/06* (2006.01)

(52) U.S. Cl.
CPC .......... *H01L 29/872* (2013.01); *H03F 3/195* (2013.01); *H01L 27/0629* (2013.01); *H01L 27/0647* (2013.01); *H01L 29/20* (2013.01); *H03F 2200/451* (2013.01)

(56) References Cited

U.S. PATENT DOCUMENTS

| | | | |
|---|---|---|---|
| 7,208,992 B1* | 4/2007 | Mukherjee | H03F 1/0205 327/317 |
| 10,381,987 B2* | 8/2019 | Chen | H03F 3/21 |
| 2006/0108660 A1 | 5/2006 | Ui | |
| 2006/0114066 A1 | 6/2006 | Oka | |
| 2007/0273447 A1 | 11/2007 | Yamamoto et al. | |
| 2011/0210788 A1 | 9/2011 | Ashida | |
| 2015/0340999 A1 | 11/2015 | Kanaya | |

FOREIGN PATENT DOCUMENTS

| | | |
|---|---|---|
| JP | 2004-254095 A | 9/2004 |
| JP | 2006-148546 A | 6/2006 |
| JP | 2006-157435 A | 6/2006 |
| JP | 2007-318463 A | 12/2007 |
| JP | 2010-041634 A | 2/2010 |
| JP | 2011-055027 A | 3/2011 |
| JP | 2011-182191 A | 9/2011 |
| JP | 2015222912 A | 12/2015 |
| KR | 10-2015-0135085 A | 12/2015 |

OTHER PUBLICATIONS

K. Kanaya et al., "A Ku-band 20 W GaN-MMIC Amplifier with Built-in Linearizer," 2014 IEEE MTT-S Int. Microwave Symp. Dig., Jun. 2014.

An Office Action mailed by the Korean Patent Office dated Feb. 8, 2021, which corresponds to Korean Patent Application 10-2019-7027531 and is related to U.S. Appl. No. 16/479,009; with English language translation.

* cited by examiner

DIODE LINEARIZER

TECHNICAL FIELD

The present invention relates to a diode linearizer mainly used for improving linearity of a GaAs-based or GaN-based compound semiconductor power amplifier.

BACKGROUND ART

Figure 7A:
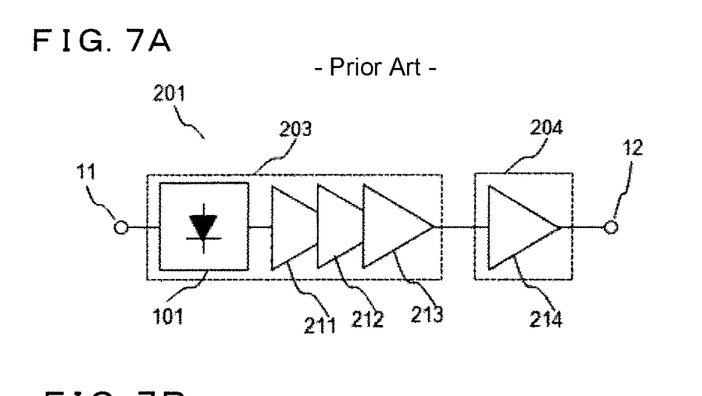
FIG. 7A A circuit example of combining a power amplifier MMIC on which a diode linearizer is mounted and an internal matching FET amplifier.
Figure 7B:
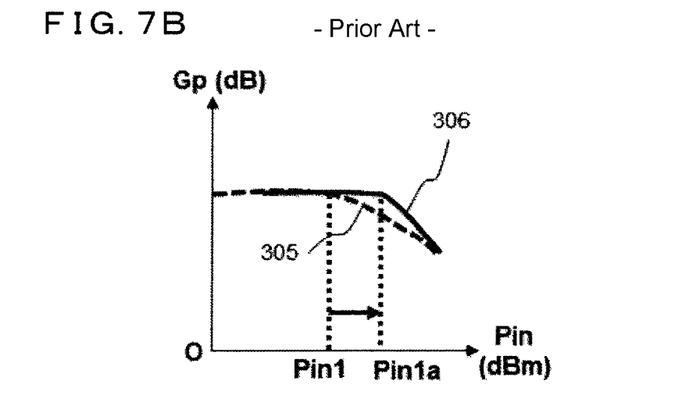
FIG. 7B An example of improving linearity of a circuit in which the power amplifier MMIC on which the diode linearizer is mounted and the internal matching FET amplifier are combined.

Linearity which is previously determined by a standard is required of a power amplifier used in a small earth station for a satellite communication as typified by 14 GHz band to suppress a reduction in a communication speed caused by a quality deterioration of a signal. FIG. 7A illustrates a configuration example of a power amplifier 201, and FIG. 7B illustrates an example of linearity. As illustrated in FIG. 7A, power being input from an RF signal input terminal 11 is amplified by multistage amplifiers 211, 212, and 213 and finally amplified to a desired power level by an internal matching field effect transistor (FET) amplifier 214, and then output from an RF signal output terminal 12. A characteristic 305 in FIG. 7B indicates an example of a power gain Gp corresponding to an input power Pin at this time.

A level at which the power gain Gp starts to decrease from a constant value in accordance with the input power Pin is Pin1 in the characteristic 305, thus a linear input power is expressed as Pin1. A diode linearizer 101 in FIG. 7A has a function of improving the linear input power Pin1 to Pin1$a$ of a characteristic 306 as illustrated in FIG. 7B. Herein, the power gain Gp equal to or less than the linear input power has a constant value, thus an output power corresponding to the linear input power Pin1 also has a linear shape. Since the improvement of the linear input power and the linear output power of the amplifier improves a distortion of the signal, it improves a signal quality and leads to the increase in the communication speed, and thus is one of important characteristic indexes in the amplifier used for the communication.

Figure 8A:
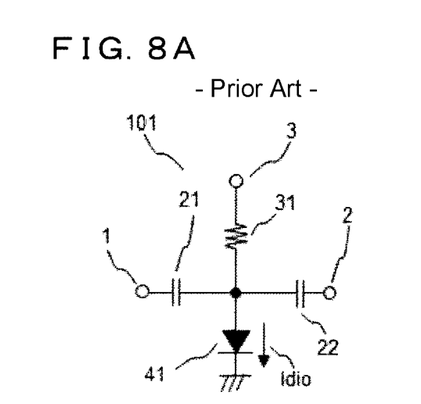
FIG. 8A A circuit configuration example of a parallel type diode linearizer.
Figure 8B:
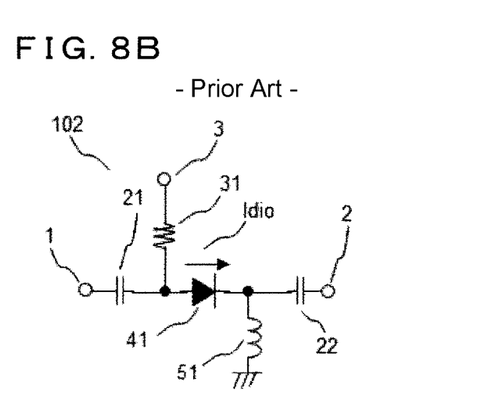
FIG. 8B A circuit configuration example of a series type diode linearizer.

The diode linearizer can be achieved by a simple circuit configuration as illustrated in FIG. 8, and is described in Patent Document 1 (p. 8, FIG. 1), Patent Document 2 (p. 9, FIG. 2), Patent Document 3 (p. 7, FIG. 1), Patent Document 4 (p. 13, FIG. 13), and Non-Patent Document 1 (FIG. 4), for example. As illustrated in FIG. 7A, a recent power amplifier is made up of a power amplifier MMIC (monolithic microwave integrated circuit) 203 including the linearizer 101 and amplifier stages 211 to 213 and a power amplifier 204 sealed in a package including the internal matching field effect transistor (FET) amplifier 214. (refer to FIG. 1 in Non-Patent Document 1, for example)

PRIOR ART DOCUMENTS

Patent Documents

Patent Document 1: Japanese Patent Application Laid-Open No. 11-355055

Patent Document 2: Japanese Patent Application Laid-Open No. 2001-144550

Patent Document 3: Japanese Patent Application Laid-Open No. 2004-254095

Patent Document 4: Japanese Patent Application Laid-Open No. 2011-182191

Non-Patent Documents

Non-Patent Document 1: 2014 Digest of IEEE MTT-S International Microwave Symposium, "A Ku-band 20 W GaN-MMIC Amplifier with Built-in Linearizer"

SUMMARY

Problem to be Solved by the Invention

The diode linearizer includes a parallel type 101 illustrated in FIG. 8A and a series type 102 illustrated in FIG. 8B. In FIG. 8A, a cathode of a diode 41 is grounded, and an anode is connected to a bias terminal 3 via a resistance 31. The anode of the diode 41 is connected to an RF signal input terminal 1 via a capacitor 21, and is connected to an RF signal output terminal 2 via a capacitor 22. In the meanwhile, in FIG. 8B, the other end of the capacitor 22 having one end connected to the RF signal output terminal 2 is connected to the cathode of the diode 41. The cathode of the diode 41 is grounded further via an RF blocking inductor 51. Idio indicated by an arrow shows a DC current flowing in the diode 41. By the function of the inductor 51, the Idio flows from the bias terminal 3 to the ground, and the RF signal does not leak in a ground direction but proceeds toward the RF signal output terminal 2. The capacitors 21 and 22 are circuit elements necessary to electrically separate a DC bias voltage of a circuit connected outside the input and output terminals 1 and 2 and a DC bias voltage applied to the diode 41.

Figure 9A:
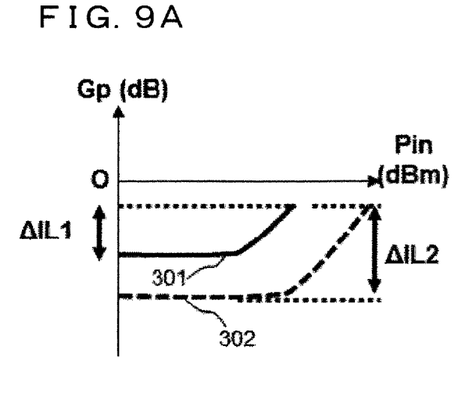
FIG. 9A A change in an insertion loss corresponding to an input power of the parallel type diode linearizer.
Figure 9B:
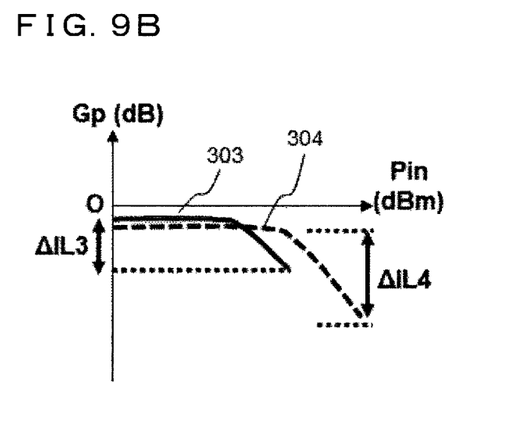
FIG. 9B A change in an insertion loss corresponding to an input power of the series type diode linearizer.

The parallel type diode linearizer 101 indicates characteristics of gain expansion in which a loss decreases from a predetermined level in accordance with an increase in an input power illustrated in FIG. 9A, and the series type diode linearizer 102 indicates characteristics of gain compression in which a loss increases from a predetermined level in accordance with an increase in an input power illustrated in FIG. 9B. In the drawings, the loss is indicated by a negative gain Gp. It depends on a design constant such as a bias current or a junction area and the number of vertical stacked stages of the diode 41 in which frequency and from which level the loss decreases and increases. For example, in the characteristic 301 in FIG. 9A, the loss decreases in a low input power level, and a change thereof is small, that is ΔIL1. In the meanwhile, in the characteristic 302, the loss starts to decrease in a high input power level, and a change thereof is large, that is ΔIL2. The same applies to characteristics 303 and 304 in FIG. 9B. These characteristics can be mostly changed by the design constant.

The characteristics of the gain expansion and gain compression described above depend on a change in a non-linear resistance in accordance with variations of an average current and an average voltage flowing in the diode. For example, the parallel type has a low resistance value in a case where the input power is small, however, when the input power exceeds a certain level, the resistance value increases due to the increase in the average current and the decrease in the average voltage. As a result, the parallel type has the decreased loss and the gain expansion characteristics. In contrast, the series type has the gain compression characteristic by reason that a passage loss increases due to an increase in the resistance value.

The gain compression characteristics which the internal matching FET amplifier 204 in FIG. 7A generally has is compensated by the gain expansion characteristics of the linearizer 101, and the linearity is improved, however, as illustrated in FIG. 9A, it is determined in accordance with a previously-designed value which characteristics are set as the gain expansion characteristics of the linearizer 101, the characteristics 301 or the characteristics 302. Thus, when the amplifier 204 is changed and an operation frequency and the gain compression characteristics of the amplifier 204 change, there is a problem that the characteristics of the amplifier cannot be appropriately compensated due to a limitation of a characteristic range which one linearizer 101 can compensate.

Means to Solve the Problem

A diode linearizer according to the present invention includes: an RF signal path having one end connected to an RF signal input terminal and another end connected to an RF signal output terminal; and at least one linearizer core unit. The at least one linearizer core unit includes: a diode having an anode and a cathode connected to a ground terminal; a resistance having one end connected to a bias terminal and another end connected to the anode; and a capacitor having one end connected to the RF signal path and another end connected to the anode. A plurality of the linearizer core units each including the bias terminal, the resistance, the diode, and the capacitor are connected in parallel between the RF signal path and the ground terminal.

Effects of the Invention

A diode linearizer according to the present invention has a configuration of parallelly mounting linearizer core units on a RF signal path via capacitors between the RF signal path and a ground, thus does not need a switch using an FET, for example, at a time of selectively operating a plurality of linearizer core units having different gain expansion characteristics. Moreover, the diode linearizer does not need a capacitor in series for blocking a direct current between RF signal input and output terminals. Thus, a range of a gain which can be compensated by the diode linearizer can be increased. Furthermore, an insertion loss of the RF signal path in a state where the diode linearizer is off can be reduced, and a range of a gain expansion in operation can be increased. The switch is not used, or the number of elements of the capacitors which are needed is small, thus a circuit size is also small.

DESCRIPTION OF EMBODIMENT(S)

A diode linearizer according to embodiments of the present invention is described with reference to the drawings. Including the drawings which have been described already, the same reference numerals will be assigned to the same or a corresponding constituent element and a repetitive description may be omitted in some cases. Described hereinafter as a main example is a case where a GaN-based or GaAs-based Schottky junction diode is used as a diode.

Embodiment 1

Figure 1A:
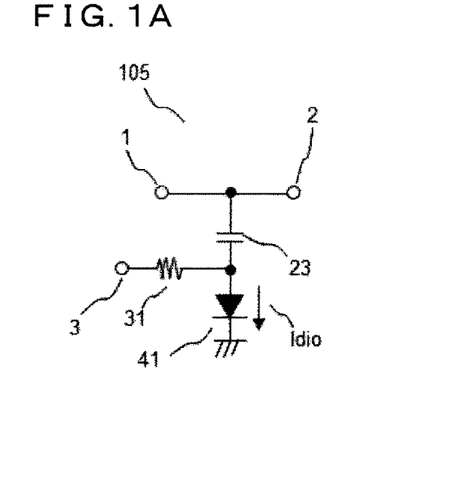
FIG. 1A A basic circuit configuration of a diode linearizer according to an embodiment 1.
Figure 1B:
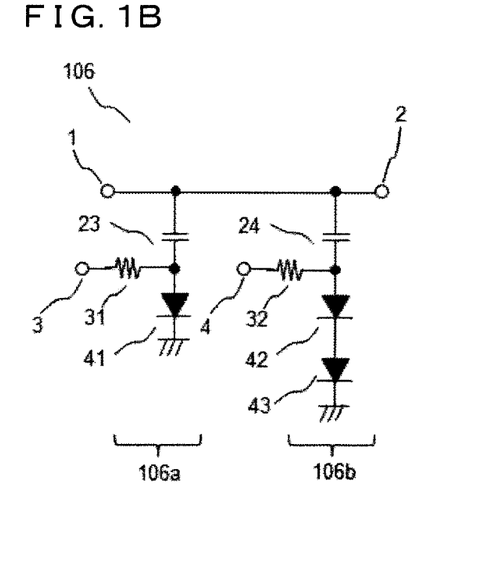
FIG. 1B A circuit configuration of the diode linearizer having a plurality of linearizer core units according to the embodiment 1.
Figure 2A:
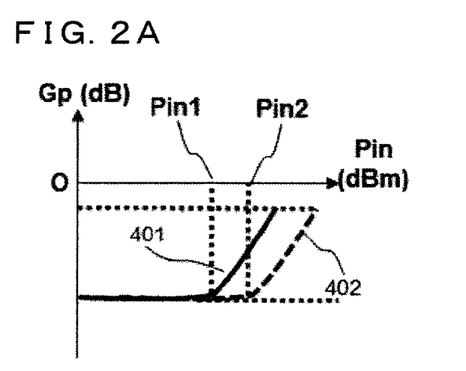
FIG. 2A A characteristic example of the diode linearizer having the plurality of linearizer core units according to the embodiment 1.
Figure 2B:
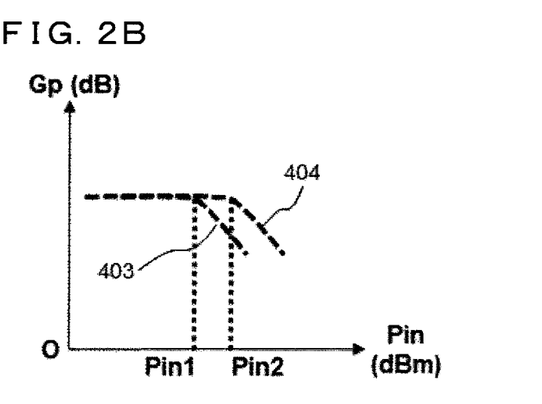
FIG. 2B A characteristic example of different internal matching FET amplifiers.

FIG. 1A illustrates a basic circuit configuration of a diode linearizer 105 according to an embodiment 1 of the present invention, and FIG. 1B illustrates a circuit configuration 106 in which two basic circuits having different compensation characteristics are parallelly connected to enlarge a compensation range of linearity of an amplifier by the linearizer. FIG. 2A illustrates a characteristic example of the diode linearizer in FIG. 1B according to the embodiment 1, FIG. 2B illustrates a gain characteristic example of internal matching FET amplifiers 204 having different gain compression characteristics, and FIG. 2C and FIG. 2D each illustrates improvement of linearity of the whole amplifiers compensated by the diode linearizer 106 in FIG. 1B according to the embodiment 1. The characteristics of the linearizer is indicated by a negative gain Gp in a manner similar to FIG. 9.

As illustrated in FIG. 1A, an RF input terminal 1 and an RF output terminal 2 are connected by an RF signal path (indicating a transmission line and a wiring), and one end of a capacitor 23 is connected to the RF signal path and the other end of the capacitor 23 is connected to an anode of the diode 41. A cathode of the diode 41 is grounded, and the anode is connected to a bias terminal 3 via a resistance 31. In an operation principle, when a value of the capacitor 23 is set so that the diode 41 has a sufficiently low impedance to an RF signal having a desired frequency, an operation of the diode linearizer 105 is equivalent to that of the parallel type diode linearizer 101 in FIG. 8A.

The operation is described. In FIG. 1A, an appropriate positive voltage is applied to the bias terminal 3, and a certain bias current Idio flows in a forward direction of the diode 41. When the RF signal is applied to the RF signal input terminal 1 and the input power is increased in this state, the bias current Idio starts to increase at a time when the input power is increased to a certain level or more, and an average anode voltage of the diode 41 starts to decrease. Correspondingly, a resistance value of the diode 41 increases, thus as indicated by a characteristic 401 or a characteristic 402 in FIG. 2A, the insertion loss is reduced and the gain expansion characteristics are provided. When the value of the capacitor 23 is appropriately set, the impedance directed to the diode 41 from the RF signal path is influenced by the change in the non-linear resistance of the diode 41. Thus, the circuit in FIG. 1A performs the operation equivalent to that in FIG. 8A from a point of view of the RF.

In FIG. 1B, another linearizer core unit 106b is connected in parallel with a linearizer core unit 106a. The linearizer core unit 106b which is added is made up of a bias terminal 4, a resistance 32, a capacitance 24, and a diode 42 and diode 43 serially connected to each other in a forward direction. The diode 43 is added for a purpose of description, however, it is also applicable that the diode 43 is not added but a junction area of the diode 42 or the values of the resistance 32 and capacitor 24 for the bias is set to be different from that of the linearizer core unit 106a.

As described above, the diode linearizer 106 has the two different linearizer core units connected in parallel with each other, thus can selectively operate the linearizer core units 106a and 106b by applying the positive bias voltage to one of the bias terminals 41 and 42 and applying 0V or the sufficiently large negative bias voltage to the other one of the bias terminals 41 and 42. As a result, in FIG. 1B, for example, when the positive bias voltage and the negative bias voltage are applied to the bias terminals 3 and 4, respectively, the diode 41 is turned on at an input power Pin1, and the characteristic 401 in FIG. 2A is obtained. When the negative bias voltage and the positive bias voltage are applied to the bias terminals 3 and 4, respectively, the diodes 42 and 43 are turned on at an input power Pin2 which is higher than the input power Pin1, and the characteristic 402 in FIG. 2A is obtained.

Considered herein is a case where the gain characteristics corresponding to the output power of the two different internal matching FET amplifiers 204 have the characteristics 403 and 404, respectively, as illustrated in FIG. 2B. In this case, the positive bias voltage is applied to the bias terminal 3 to obtain the characteristic 401 in the diode linearizer 106 when the amplifier 204 having the characteristic 403 in which the gain compression starts at the input power Pin1 is used, and the positive bias voltage is applied to the bias terminal 4 to obtain the characteristic 402 when the amplifier 204 having the characteristic 404 in which the gain compression starts at the input power Pin2 is used.

Figure 2C:
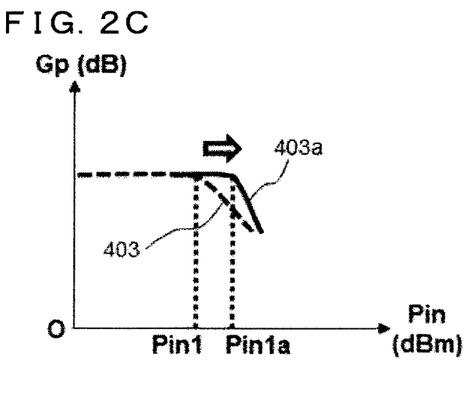
FIG. 2C An example 1 of improving linearity of the different internal matching FET amplifiers using the plurality of linearizer core units according to the embodiment 1.
Figure 2D:
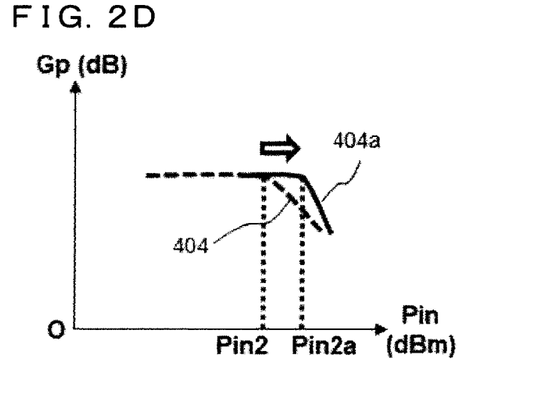
FIG. 2D An example 2 of improving linearity of the different internal matching FET amplifiers using the plurality of linearizer core units according to the embodiment 1.

As a result, in the whole amplifier of the diode linearizer 106 and the amplifier 204, as illustrated in FIGS. 2C and 2D, the characteristic 403 is improved to a characteristic 403a or the characteristic 404 is improved to a characteristic 404a, and the linear input power can be improved from Pin1 to Pin1a or from Pin2 to Pin2a. As described already, the linear output power is also improved in accordance with the improvement of the linear input power.

Figure 3A:
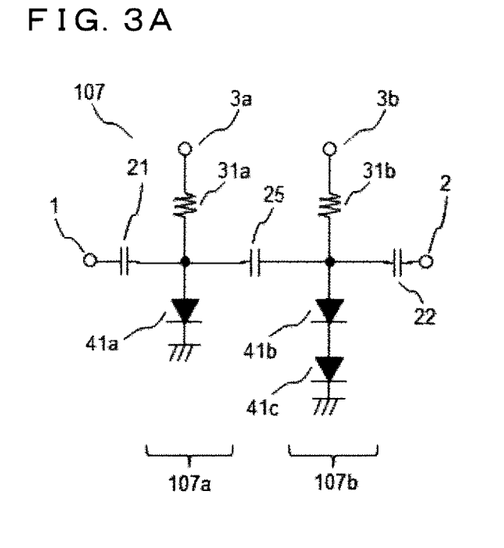
FIG. 3A A circuit configuration example 1 of the diode linearizer having the plurality of linearizer core units for comparison.

A feature of FIG. 1B is described next using a comparison circuit example. FIG. 3A illustrates a circuit configuration of a comparison circuit 1, and corresponds to the circuit described in Patent Document 3. Linearizer core units 107a and 107b are provided in parallel with each other between the signal path from the RF signal input terminal 1 to the RF signal output terminal 2 and the ground. The linearizer core unit 107a is a parallel type unit made up of a bias terminal 3a, a resistance 31a, and a diode 41a, and the linearizer core unit 107b is made up of a bias terminal 3b, a resistance 31b, and diodes 41b and 41c and corresponds to the linearizer core unit 106b in FIG. 1B. FIG. 3A is different from FIG. 1B in that the linearizer core units 107a and 107b are connected by a capacitor 25 and three capacitors of capacitors 21, 25, and 22 are required in the signal path from the RF signal input terminal 1 to the RF signal output terminal 2 in FIG. 3A, however, in FIG. 1B, there is no capacitor serially inserted into the signal path but the two capacitors 23 and 24 each constituting a branch from the signal path are provided instead.

Figure 3B:
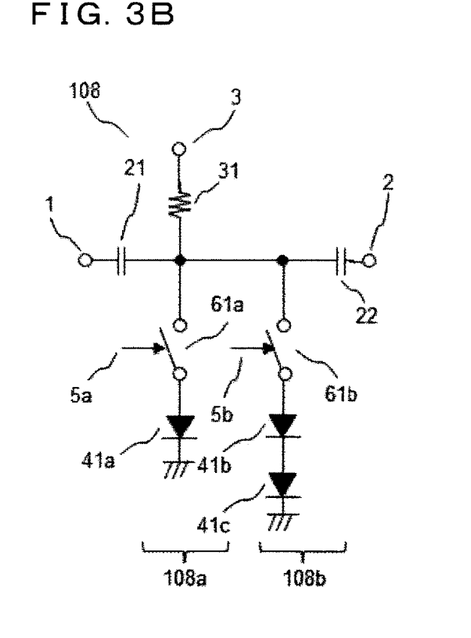
FIG. 3B A circuit configuration example 2 of the diode linearizer having the plurality of linearizer core units for comparison.

FIG. 3B illustrates a circuit configuration of a comparison circuit 2 according to another embodiment, and corresponds to the circuit described in Patent Document 4. FIG. 3B is the same as FIG. 3A and FIG. 1B in that linearizer core units 108a and 108b are provided in parallel with each other between the signal path from the RF signal input terminal 1 to the RF signal output terminal 2 and the ground, however, FIG. 3B is different from FIG. 3A and FIG. 1B in that switches 61a and 61b are serially connected to the diode to switch the linearizer core units 108a and 108b and control terminals 5a and 5b of the switches are added.

Figure 4A:
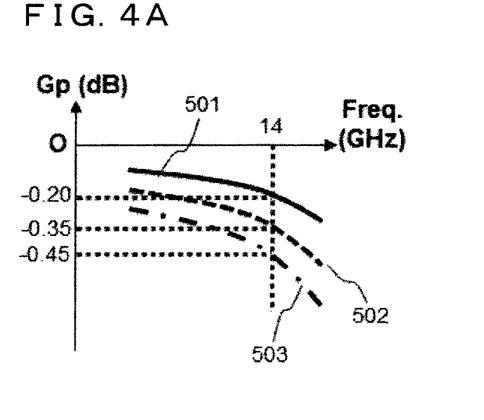
FIG. 4A A frequency characteristic of the diode linearizer having the plurality of linearizer core units according to the embodiment 1 and a comparison circuit.

FIG. 4A illustrates a frequency characteristic example (simulation) of the insertion loss between the RF signal input terminal 1 and the RF signal output terminal 2 in a case where the diode linearizers in FIG. 1B, FIG. 3A, and FIG. 3B are put into an off state. Characteristics 501, 502, and 503 express the insertion loss in FIG. 1B, FIG. 3A, and FIG. 3B, respectively. In the present example, the losses of the characteristics 501, 502, and 503 in 14 GHz are 0.20 dB, 0.35 dB, and 0.45 dB, respectively.

A difference in the characteristics in FIG. 4A is caused by a parasitic resistance of the diodes in the off state and influences of the capacitors 21 to 25 and the switches 61a and 61b. Presence or absence of the switch has a large influence on the difference between FIG. 1B and FIG. 3B. In an integrated circuit, a switch is achieved using a FET switch or a diode switch. Thus, the parasitic resistance of the switch in the off state cannot be ignored. Since, in FIG. 3B, this parasitic resistance has the large influence, the loss increases compared to FIG. 1B. Furthermore, in FIG. 3B, the capacitors 21 and 22 are serially connected to the RF signal path. In a frequency range above 10 GHz, the loss caused by the parasitic resistance of the capacitor which is normally achieved by a MIM capacitor or an interdigital capacitor cannot be ignored, thus, in FIG. 3B, the insertion loss increases compared to FIG. 1B. The loss in the capacitor is significantly large in millimeter waveband (for example, 40 GHz or larger).

When FIG. 1B and FIG. 3A are compared, the capacitors 21 and 22 are serially connected to the RF signal path in FIG. 3A. Thus, the insertion loss in FIG. 3A increases compared to FIG. 1B in which the RF signal path has no capacitor which is serially connected. With regard to FIGS. 3A and 3B, the parasitic resistance of the switches 61a and 61b in the off state have the larger influence of loss than the influence of the parasitic resistance caused by the capacitor 25, thus the larger loss occurs in FIG. 3B.

As described above, the linearizer according to the embodiment 1 has the effect that the insertion loss at the time of not operating the linearizer can be reduced.

Figure 4B:
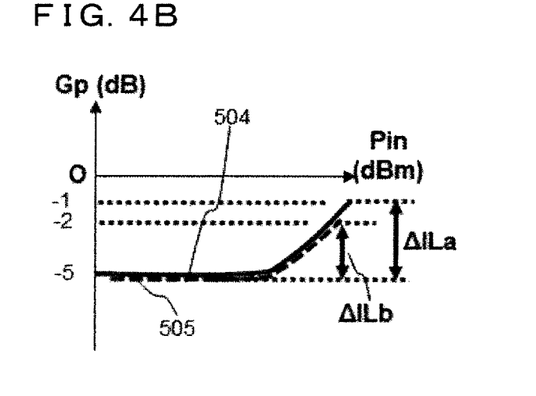
FIG. 4B Characteristics of an insertion loss corresponding to an input power of the diode linearizer having the plurality of linearizer core units according to the embodiment 1 and a comparison circuit.

FIG. 4B illustrates a gain expansion characteristic example (simulation) in FIG. 1B and FIG. 3B in a case where the linearizer is operated at 14 GHz. Since a variation ΔILa of the gain (loss) of the characteristic 504 in FIG. 1B is larger than a variation ΔILb of the gain (loss) in FIG. 3B, a compensation amount of the gain compression characteristics of the amplifier is also large. This difference is caused by presence or absence of on resistance of the switches 61a and 61b in the on state. In FIG. 3B, the variation of the loss is smaller than the characteristic in FIG. 1B, to which the on resistance is not added, by the amount of the on resistance of the switch. Although not shown in the drawings, there is also the difference of the variation of the loss between FIG. 1B and FIG. 3A. The variation of the loss in FIG. 3A is reduced by the amount the parasitic resistance of the capacitors 21, 22, and 25 compared to that in FIG. 1B. However, the difference of the variation in this case is normally considerably small compared to the difference between ΔILa and ΔILb, that is approximately 1 dB, illustrated in FIG. 4B.

As described above, the linearizer according to the embodiment 1 has the effect that the range of the gain expansion can be increased by reason that it is not easily influenced by the parasitic resistance. Since the capacitor 25 and the switches 61a and 61b are unnecessary, a circuit size can be reduced.

As described above, the diode linearizer according to the embodiment 1 has the configuration of parallelly mounting the linearizer core units on the RF signal path via the capacitors between the RF signal path and the ground, thus does not need the switch using the FET, for example, at the time of selectively operating the plurality of linearizer core units having the different gain expansion characteristics. Moreover, the diode linearizer does not need the capacitor in series for blocking the direct current between the RF signal input and output terminals. Thus, the range of the gain which can be compensated by the diode linearizer can be increased. Furthermore, the insertion loss of the RF signal path in the state where the diode linearizer is off can be reduced, and the range of the gain expansion in operation can be increased. The switch is not used, or the number of elements of the capacitors which are needed is small, thus the circuit size is also small.

Embodiment 2

Figure 5A:
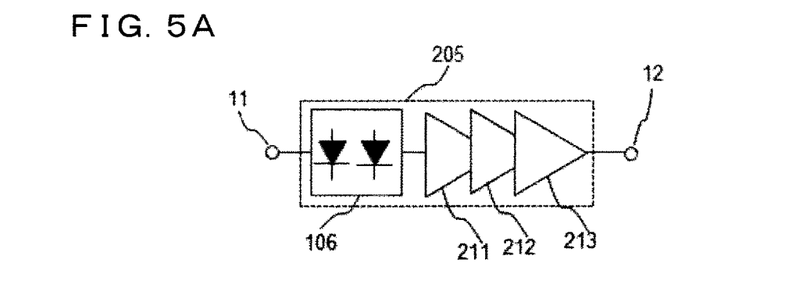
FIG. 5A A power amplifier MMIC on which a diode linearizer having a plurality of linearizer core units according to an embodiment 2 is mounted in a first stage.
Figure 5B:
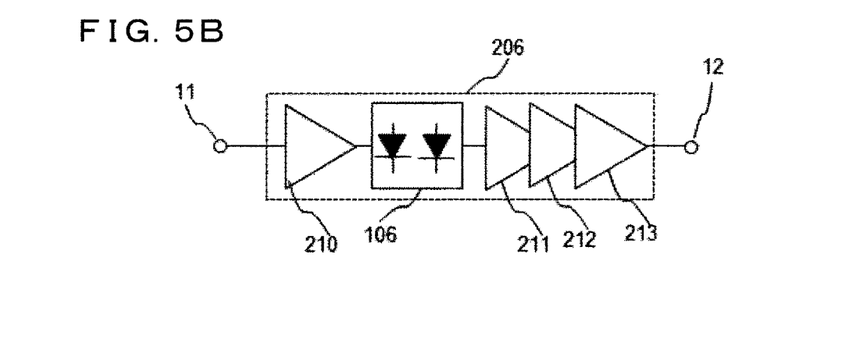
FIG. 5B A power amplifier MMIC on which the diode linearizer having the plurality of linearizer core units according to the embodiment 2 is mounted between stages.

FIG. 5 illustrates a circuit configuration of a power amplifier MMIC including a diode linearizer 106 according to the embodiment 2 of the present invention. FIG. 5A is a circuit configuration of a power amplifier MMIC 205 in which the diode linearizer 106 in FIG. 1B is disposed in front of amplifier stages 211 to 213, and FIG. 5B is a circuit configuration of a power amplifier MMIC 206 in which the diode linearizer 106 is located between a first stage 210 and the second stage 211. The both configurations indicate a case of being integrated on the same semiconductor chip.

As described in Non-Patent Document 1, the configuration in FIG. 5B is preferable to the configuration in FIG. 5A in many cases from a point of view of a reduction in noise factor.

In any of the configurations, the circuit constant of the diode linearizer 106 having the plurality of linearizer core units is appropriately set, thereby being able to compensate the gain compression characteristics of the amplifier stages 211 to 213 or the amplifier stages 210 to 213 over the large frequency range compared to a case where there is the single linearizer core unit (the case in FIG. 1A). As a result, the power amplifier MMIC having the favorable linearity over the wide band can be provided.

Since the diode linearizer 106 has the effect described in the embodiment 1, thus the circuit size can be reduced compared to the power amplifier MMIC 201 mounting the diode linearizer (for example, the circuit configuration in FIG. 3A or FIG. 3B) for comparison.

Furthermore, when the diode linearizer 106 is used in the off state, the power gain of the power amplifier MMIC 201 can also be increased. Although the diode linearizer having the plurality of linearizer core units in FIG. 1B is described as the example, when the plurality of core units are not necessary, that is to say, when only the basic configuration in FIG. 1A is used as the linearizer core unit, the configuration described above can contribute to the downsizing by reason that the number of capacitors is small. In the present example, the diode linearizer 106 and the amplifier stages 210 to 213 are formed on the same semiconductor chip, thus expected is the effect that the influence of a production tolerance on the gain characteristics in which the linearity is improved can be reduced compared to a case where the diode linearizer 106 and the amplifier stages 210 to 213 are manufactured on separate chips.

The formation of the diode linearizer 106 described in the embodiment 2 and the amplifier stages 210 to 213 on the same semiconductor chip particularly has the large effect when they are formed on a GaN-based semiconductor chip. It is known that the amplifier stage using a GaN-based FET often has the gain compression characteristics at a low input power (called soft compression). Thus, the suppression of the soft compression in the whole amplifier (improvement of the linearity) by the integration of the diode linearizer 106 practically has a large importance in many cases from a point of view of suppressing a deterioration of a signal quality. (refer to Non-Patent Document 1)

Embodiment 3

Figure 6:
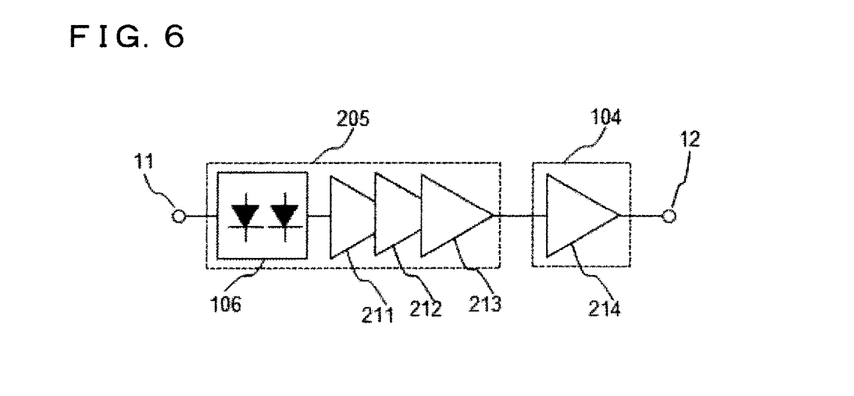
FIG. 6 A circuit example of combining a power amplifier MMIC on which a diode linearizer having a plurality of linearizer core units according to an embodiment 3 is mounted and an internal matching FET amplifier in an output stage.

FIG. 6 illustrates a circuit configuration of a power amplifier MMIC 205 including a diode linearizer 106 according to the embodiment 3 of the present invention and an internal matching FET amplifier 104. Herein, the diode linearizer 106 mounted on the power amplifier MMIC 205 has the circuit configuration illustrated in FIG. 1B. Assumed is a case where the FET amplifier 104 is subsequently disposed as the amplifier having the different linear input power as usage as illustrated in FIG. 2B.

The circuit constant of the diode linearizer 106 having the plurality of linearizer core units is appropriately preset, thus the output characteristics having the favorable linearity can be provided even when the gain compression characteristics of the amplifier 104 is different from the gain compression characteristics of the amplifier stages 211 to 213 and the internal matching FET amplifier 104.

Since the diode linearizer 106 has the effect described in the embodiment 1, thus the circuit size of the whole amplifier can be reduced compared to the case of constituting the whole amplifier using the power amplifier MMIC 201 mounting the diode linearizer (for example, the circuit configuration in FIG. 3A or FIG. 3B) described in the comparison example and the internal matching FET amplifier 104. Furthermore, when the diode linearizer 106 is used in the off state, the power gain of the whole amplifier can be increased.

The embodiments described above exemplify the case of using the GaN-based or GaAs-based Schottky junction diode as the diode, however, it is also applicable to use a GaN-based or GaAs-based pn junction diode instead of the Schottky junction diode. Note that the similar effect can be obtained by a function equivalent to that of the diode, thus the effect described already can be obtained by an npn type bipolar transistor (including a hetero junction transistor) (for example, a GaN-based, GaAs-based, InP-based SiGe-based, and Si-based bipolar transistor) having an anode made by connecting a base and a collector of the bipolar transistor and an emitter as a cathode, and a diode-connected enhancement mode (normally off) FET (for example, a GaN-based FET, a GaAs-based FET, and an Si-based MOSFET) having an anode made by connecting a drain and a gate and a source as a cathode.

Barrier potential of the GaN-based or GaAs-based pn junction diode and barrier potential of the diode-connected npn type bipolar transistor are approximately 0.9 to 1.2 V, and are higher than barrier potential of the GaN-based or GaAs-based Schottky junction diode, that is approximately 0.6 to 0.8 V. Thus, when the diode 41 has the same number of vertical stacked stages, the linear input power for achieving the gain expansion characteristics can be set to high. As a result, when the linear input power required by the internal matching FET amplifier 104 in FIG. 6 is high, the desired linear input power can be achieved using the smaller number of vertical stacked stages of the diode 41, thus the circuit size of the linearizer core unit of the linearizer 106 can be further reduced.

In the meanwhile, there is also a case where the desired linear input power is low, for example, a case where the barrier potential of approximately 0.6 to 0.8 V of the Schottky junction diode is high for the desired linear input power or a case where the barrier potential corresponding to the desired linear input power does not correspond to a multiple number of the barrier potential of the diode, such as 1.0 V. In such a case, the diode-connected enhancement mode FET is useful. The reason is that a threshold voltage of the enhancement mode FET used in an integrated circuit in microwave band is low, that is approximately 0.15 to 0.3 V. The enhancement mode FET has the low threshold voltage corresponding to the barrier potential of the diode, thus can easily achieve the gain expansion characteristics at the lower linear input power, and is appropriate for a fine adjustment of the number of vertical stacked stages. For example, the barrier potential of 1.0 V can be achieved by vertically stacking the four enhancement mode FETs.

EXPLANATION OF REFERENCE SIGNS

1: RF signal input terminal
2: RF signal output terminal
3, 4, 3*a*, 3*b*: bias terminal
5*a*, 5*b*: control terminal of switch
21 to 25: capacitor
31, 32, 31*a*, 32*b*: resistance
41, 42, 43, 41*a*, 41*b*, 41*c*: diode
51: inductor

61*a*, 61*b*: switch
101 to 108: diode linearizer
106*a*, 106*b*, 107*a*, 107*b*, 108*a*, 108*b*: linearizer core unit
301 to 306: characteristic
401 to 404, 403*a*, 404*a*: characteristic according to embodiment 1
501, 504: characteristic of FIG. 1B according to embodiment 1
502, 503, 505: characteristic of comparison circuit

The invention claimed is:

1. A diode linearizer, comprising:
an RF signal path having one end connected to an RF signal input terminal and another end connected to an RF signal output terminal; and
a plurality of linearizer core units, each of the linearizer core units including:
a diode having an anode and a cathode connected to a ground terminal;
a resistance having one end connected to a bias terminal and another end connected to the anode; and
a capacitor having one end connected to the RF signal path and another end connected to the anode,
wherein the plurality of the linearizer core units are connected in parallel between the RF signal path and the ground terminal.

2. The diode linearizer according to claim 1, wherein the diode is a GaAs-based or GaN-based Schottky junction diode.

3. The diode linearizer according to claim 1, wherein the diode is a GaAs-based or GaN-based pn junction diode.

4. The diode linearizer according to claim 1, wherein a diode-connected bipolar transistor or a diode-connected enhancement mode FET is configured as the diode.

5. The diode linearizer according to claim 1, wherein one of the linearizer core units includes another diode connected in series between the cathode of the diode and the ground terminal.

6. A diode linearizer, comprising:
a semiconductor chip; and
a plurality of linearizer core units, each of the linearizer core units including:
an RF signal path having one end connected to an RF signal output terminal in a first amplifier stage formed on the semiconductor chip and another end connected to an RF signal input terminal of a second amplifier stage formed on the semiconductor chip; and
a diode formed on the semiconductor chip and having an anode and a cathode connected to a ground terminal;
a resistance formed on the semiconductor chip and having one end connected to a bias terminal and another end connected to the anode; and
a capacitor formed on the semiconductor chip and having one end connected to the RF signal path and another end connected to the anode,
wherein the plurality of the linearizer core units are connected in parallel between the RF signal path and the ground terminal.

7. The diode linearizer according to claim 6, wherein the semiconductor chip is a GaN-based chip.

8. The diode linearizer according to claim 6, wherein one of the linearizer core units includes another diode connected in series between the cathode of the diode and the ground terminal.

* * * * *